United States Patent
Shih et al.

(10) Patent No.: US 9,986,632 B2
(45) Date of Patent: May 29, 2018

(54) WATER COOLING SYSTEM

(71) Applicant: COOLER MASTER CO., LTD., New Taipei (TW)

(72) Inventors: Shun-Yu Shih, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days. days.

(21) Appl. No.: 15/430,446

(22) Filed: Feb. 11, 2017

(65) Prior Publication Data
US 2017/0245357 A1    Aug. 24, 2017

(30) Foreign Application Priority Data

Feb. 24, 2016  (TW) .............................. 105105455 A

(51) Int. Cl.
*H05K 1/02* (2006.01)
*G06F 1/20* (2006.01)

(52) U.S. Cl.
CPC ............. *H05K 1/0203* (2013.01); *G06F 1/20* (2013.01)

(58) Field of Classification Search
CPC .......................... H05K 1/0203; H01L 23/473
See application file for complete search history.

(56) References Cited

U.S. PATENT DOCUMENTS

| | | | |
|---|---|---|---|
| 6,926,070 B2 * | 8/2005 | Jenkins | F28F 1/32 165/104.33 |
| 7,209,356 B2 * | 4/2007 | Lee | H01L 23/427 165/104.21 |
| 9,247,674 B2 * | 1/2016 | Okamoto | H05K 7/20209 |
| 2006/0196643 A1 * | 9/2006 | Hata | G06F 1/1616 165/104.33 |
| 2012/0087088 A1 * | 4/2012 | Killion | F28D 15/0266 361/697 |
| 2012/0136622 A1 | 5/2012 | Schauer et al. | |

FOREIGN PATENT DOCUMENTS

| | | |
|---|---|---|
| TW | I227824 B | 2/2005 |
| TW | M279915 U | 11/2005 |
| TW | M326662 U | 2/2008 |
| TW | M454562 U | 6/2013 |
| TW | M516708 U | 2/2016 |

OTHER PUBLICATIONS

Office Action dated Oct. 27, 2016 of corresponding Taiwan patent application.

* cited by examiner

*Primary Examiner* — Mukund G Patel
(74) *Attorney, Agent, or Firm* — Maschoff Brennan

(57) ABSTRACT

Disclosed is a water cooling system for a circuit board with heat generating components. The water cooling system includes a fin module, a water block, a liquid guiding tube and a fan. The fin module is installed on the circuit board and has a through hole; the water block is clamped between the fin module and the circuit board and has a side thermally coupled to the heat generating components, and further has a liquid inlet end and a liquid outlet end; the liquid guiding tube communicates with the liquid inlet end and the liquid outlet end and passes and is fixed into the through hole and thermally coupled to an inner wall of the through hole; and the fan is configured to be corresponsive to the fin module. Therefore, the water cooling system has the advantages of reduced volume and high cooling efficiency.

21 Claims, 9 Drawing Sheets

WATER COOLING SYSTEM

FIELD OF THE INVENTION

This disclosure relates generally to a heat dissipating device, and more particularly to a water cooling system.

BACKGROUND OF THE INVENTION

As science and technology advance, 3C products have more and more functions, and the amount of heat generated by electronic components of the 3C products becomes increasingly greater. If the temperature of the electronic components is too high, the performance, stability, and operation of the electronic components will be adversely affected, so that it is necessary to dissipate the heat generated by the electronic components in order to maintain a normal operation of the electronic components.

However, some special electronic components such as display cards need to be cooled down quickly, but most present 3C products pursue a light, thin, short and compact design, and it is a common issue for related manufacturers to install a high-performance cooling device in the limited space of the 3C products in order to dissipate the heat to the outside.

In view of the aforementioned drawbacks of the prior art, the discloser of this disclosure based on years of experience in the related industry to conduct extensive research, and experiment, and finally provided a feasible and effective solution in accordance with this disclosure to overcome the drawbacks of the prior art.

SUMMARY OF THE INVENTION

Therefore, it is a primary objective of the present invention to provide a water cooling system comprising a water block clamped between a fin module and a circuit board, so that the circuit board, the water block and the fin module are stacked on top of each other, and a liquid guiding tube is passed and fixed to the fin module and thermally coupled to the fin module to achieve the effect of reduced volume and high cooling efficiency of the water cooling system.

To achieve the aforementioned and other objectives, this disclosure provides a water cooling system for a circuit board having a heat generating component installed thereon, and the water cooling system comprises: a fin module, installed on the circuit board, and having at least one through hole; a water block, clamped between the fin module and the circuit board, and having a side thermally coupled to the heat generating component, and further having a liquid inlet end and a liquid outlet end; at least one liquid guiding tube, communicated with the liquid inlet end and the liquid outlet end, and passed and fixed into the through hole, and thermally coupled to an inner wall of the through hole; and a fan, configured to be corresponsive to the fin module.

To achieve the aforementioned and other objectives, this disclosure also provides a water cooling system for a display card having a graphic processing unit installed thereon, and the water cooling system comprises: a fin module, installed on the display card, and having least one through hole; a water block, clamped between the fin module and the display card, and having a top thermally coupled to the fin module, and a bottom thermally coupled to the graphic processing unit, and further having a liquid inlet end and a liquid outlet end; a liquid guiding tube, with an end communicated with the liquid inlet end, and the other end communicated with the liquid outlet end, and the liquid guiding tube being passed and fixed into the through hole and thermally coupled to an inner wall of the through hole; and a fan, installed to the top side of the fin module.

This disclosure further has the following effects, a portion of the bottom side of the fin module has a concave groove, and the water block is accommodated in the concave groove, so that the heated area of the fin module is greater than the heated area of the water block, and the height difference between the heated area of the fin module and the heated area of the water block is reduced to allow the other portion of the bottom side of the fin module to be thermally coupled to the electronic component successfully, so as to improve the thermal exchange efficiency of the water cooling system.

DESCRIPTION OF THE PREFERRED EMBODIMENTS

The technical contents of the present invention will become apparent with the detailed description of preferred embodiments accompanied with the illustration of related drawings as follows. It is noteworthy that the preferred embodiments are provided for illustrating this disclosure rather than restricting the scope of the disclosure.

Figure 1:
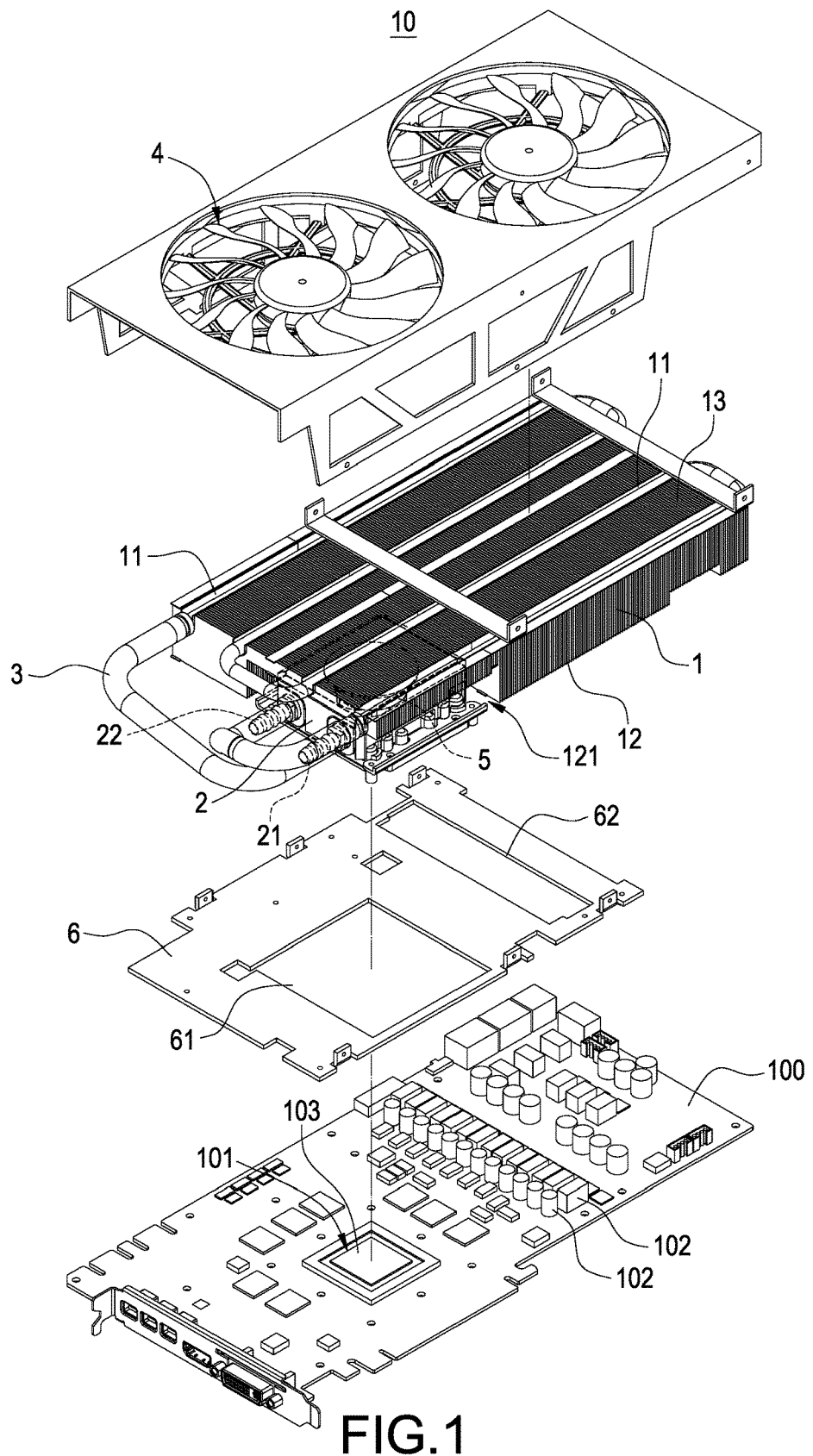
FIG. 1 is an exploded view of a water cooling system in accordance with a first preferred embodiment of this disclosure.
Figure 2:
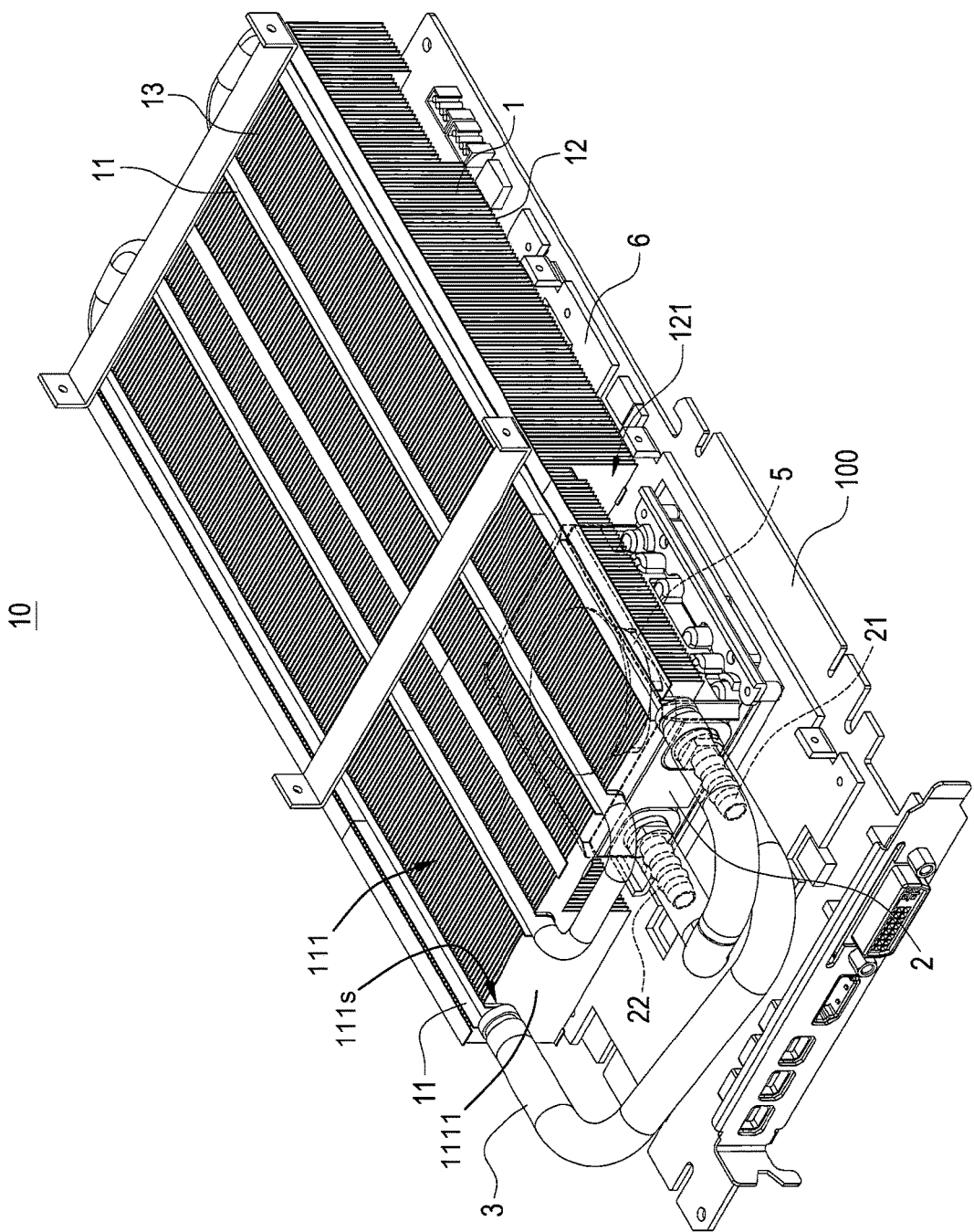
FIG. 2 is a perspective view of a water cooling system in accordance with the first preferred embodiment of this disclosure.
Figure 3:
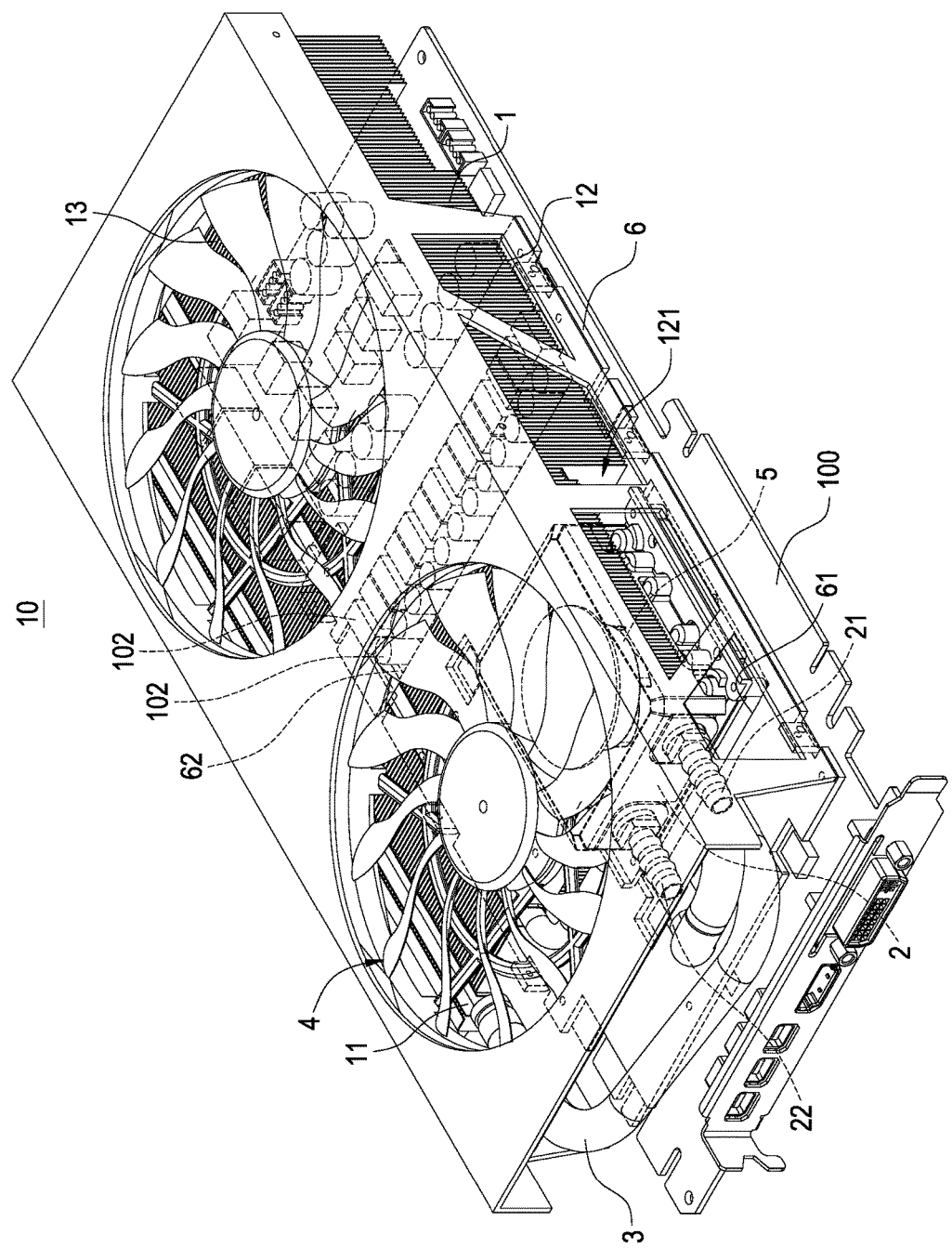
FIG. 3 is another perspective view of a water cooling system in accordance with the first preferred embodiment of this disclosure.

With reference to FIGS. 1 to 3 for a water cooling system 10 in accordance with the first preferred embodiment of this disclosure, the water cooling system 10 comprises a fin module 1, a water block 2, one or more liquid guiding tubes 3, and a fan 4.

In FIG. 1, the water cooling system 10 is applied to a circuit board 100 which may be a display card or any other interface card, and the circuit board 100 includes a heat generating component 101 and a plurality of electronic components 102, and heat generating component 101 may be a graphic processing unit (GPU) 103, a memory, a digital micro-mirror device (DMD) chip or any other component. In this preferred embodiment, the circuit board 100 is a display card, and the heat generating component 101 is a graphic processing unit 103.

In FIGS. 1 to 3, the fin module 1 is installed on the circuit board 100, and the fin module 1 has one or more through holes 11, a bottom side 12 and a top side 13, and a portion of the bottom side 12 of the fin module 1 has a concave groove 121, and the other portion of the bottom side 12 is thermally coupled to the electronic component 102. Wherein, the quantity of through holes 11 in this preferred embodiment is plural, and the through holes are formed inwardly from a top side 13 of the fin module 1 and spaced parallel to one another. However, this disclosure is not limited by such arrangements.

In FIGS. 1 to 3, the water block 2 is vertically clamped between the fin module 1 and the circuit board 100 so as to be disposed between the fin module 1 and the circuit board 100 in a vertical direction D1, and a side of the water block 2 is thermally coupled to the heat generating component 101, and the water block 2 has a liquid inlet end 21 and a liquid outlet end 22. Wherein, the top of the water block 2 of this preferred embodiment is thermally coupled to the fin module 1, and the bottom of the water block 2 is thermally coupled to the heat generating component 101. In more detail, as shown in FIG. 2, the fin module 1 includes a plurality of fins 111 installed on the circuit board 100, each of the fins 111 has at least one cut-out notch 111s formed in an upper surface 1111 thereof. The cut-out notches 111s of the fins 111 form the through holes 11.

Specifically, the water block 2 is accommodated in the concave groove 121, and the top of the water block 2 is thermally coupled to an inner wall of the concave groove 121, so that the water block 2 can exchange heat with the fin module 1 quickly.

In FIGS. 1 to 3, an end of the liquid guiding tube 3 is communicated with the liquid inlet end 21, and the other end of the liquid guiding tube 3 is communicated with the liquid outlet end 21, and the liquid guiding tube 3 is passed and fixed into the through hole 11 and thermally coupled to the inner wall of the through hole 11.

In FIGS. 1 to 3, the fan 4 is configured to be corresponsive to the fin module 1. Specifically, the fan 4 of this preferred embodiment is installed to the top side 13 of the fin module 1. However, this disclosure is not just limited to such arrangement only, but the fan 4 may also be installed on a lateral side of the fin module 1 as well. Since there is not much space above the graphic processing unit 103, therefore the fin module 1, the water block 2, and the fan 4 have a total thickness from 2.0 cm to 5.4 cm.

In FIGS. 1 to 3, the water cooling system 10 of this disclosure further comprises a pump 5 accommodated inside the water block 2, and the pump 5 drives a working fluid (such as water or a coolant) circulated inside the water block 2 and the liquid guiding tube 3.

In FIG. 1, the water cooling system 10 of this disclosure further comprises a fixed board 6 fixed onto the circuit board 100, and the fin module 1 is fixed on the fixed board 6, and the fixed board 6 has a first through opening 61 and a second through opening 62, The water block 2 is passed through the first through opening 61, fixed to the circuit board 100, and thermally coupled to the heat generating component 101, and the bottom side 12 of the fin module 1 is passed through the second through opening 62 and thermally coupled to the electronic component 102.

In the assembly of the water cooling system 10 of this disclosure FIGS. 1 to 3, the fin module 1 is installed on the circuit board 100 and has a through hole 11; the water block 2 is clamped between the fin module 1 and the circuit board 100, and the top of the water block 2 is thermally coupled to the fin module 1, and the bottom of the water block 2 is thermally coupled to the heat generating component 101, and the water block 2 has a liquid inlet end 21 and a liquid outlet end 22; the liquid guiding tube 3 has an end communicated with the liquid inlet end 21 and the other end communicated with the liquid outlet end 22, and the liquid guiding tube 3 is passed and fixed into the through hole 11 and thermally coupled to an inner wall of the through hole 11; and the fan 4 is configured to be corresponsive to the fin module 1 or installed at the top side 13 of the fin module 1.

In a using status of the water cooling system 10 of this disclosure as shown in FIGS. 1 to 3, the circuit board 100, the water block 2 and the fin module 1 are stacked on top of one another, so that the water cooling system 10 has the effect of reducing the volume. In addition, the liquid guiding tube 3 is passed and fixed to the fin module 1 and thermally coupled to the fin module 1, so that when the heat generated by the heat generating component 101 is transmitted to the water block 2, the top of the water block 2 and the working fluid (such as water or coolant) in the liquid guiding tube 3 can transmit the heat to the fin module 1 quickly, and finally the fin module 1 and the fan 4 dissipate the heat to the outside to achieve an excellent heat dissipation efficiency of the water cooling system 10.

In addition, a portion of the bottom side 12 of the fin module 1 has a concave groove 121, and the water block 2 is accommodated in the concave groove 121, so that the fin module 1 has a heated area greater than the heated area of the water block 2, and the height difference between the heated area of the fin module 1 and the heated area of the water block 2 is reduced to allow the other portion of the bottom side 12 of the fin module 1 to be thermally coupled to the electronic component 102 to improve the heat exchange efficiency of the water cooling system 10.

Figure 4:
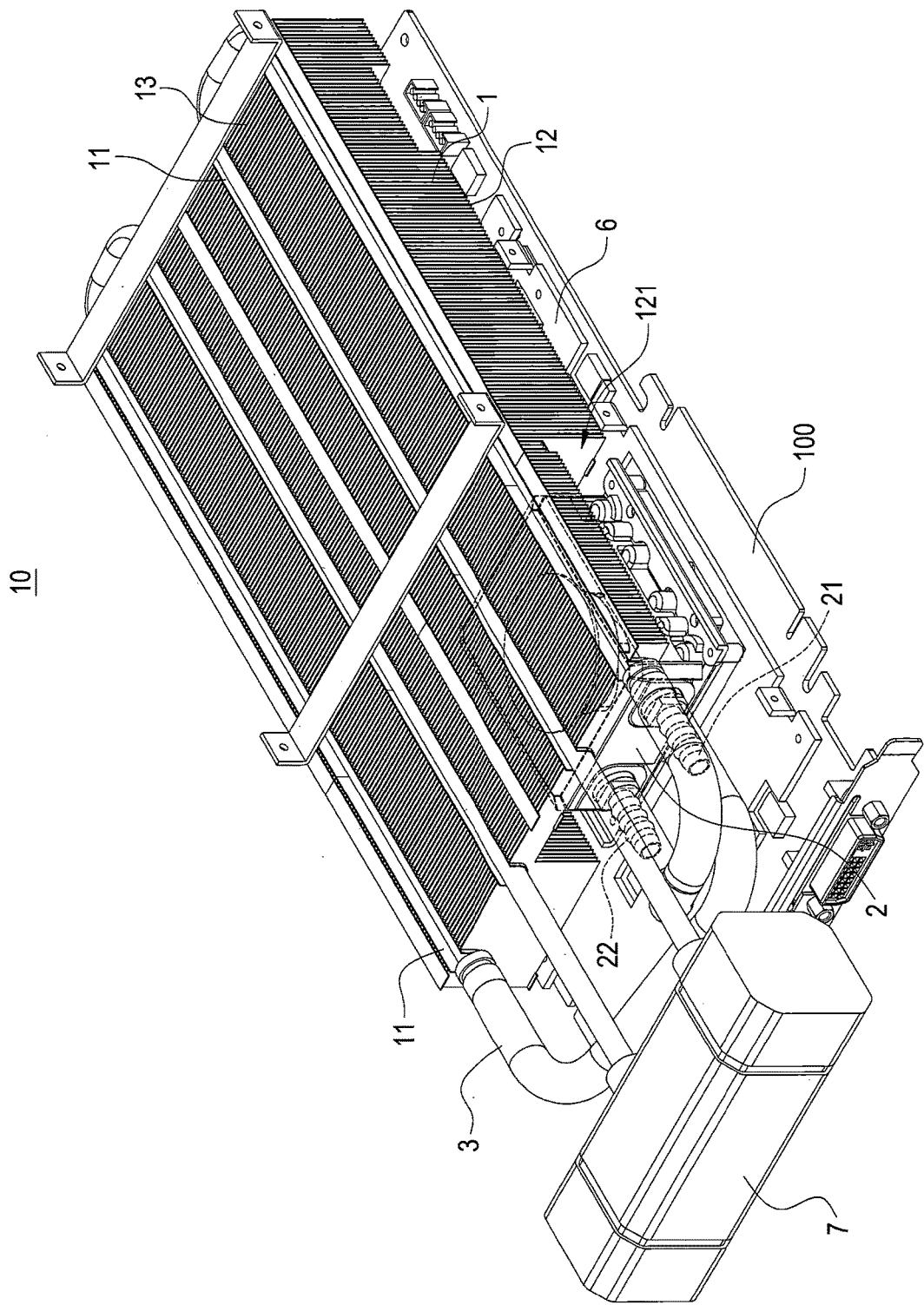
FIG. 4 is a perspective view of a water cooling system in accordance with a second preferred embodiment of this disclosure.
Figure 5:
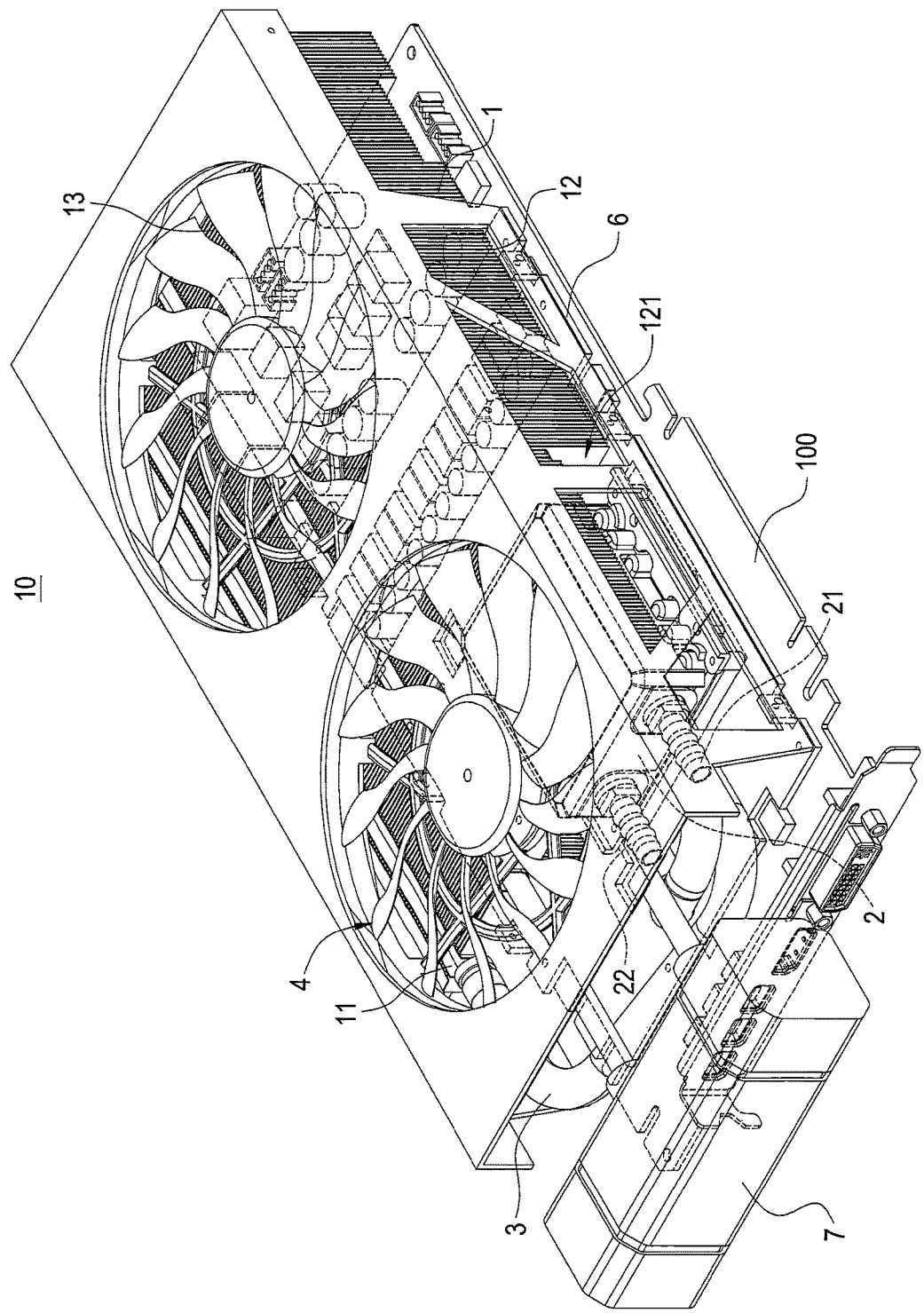
FIG. 5 is another perspective view of a water cooling system in accordance with the second preferred embodiment of this disclosure.

With reference to FIGS. 4 and 5 for a water cooling system 10 in accordance with the second preferred embodiment of this disclosure, the second preferred embodiment is substantially the same as the first preferred embodiment except that the pump 5 of the first preferred embodiment is changed to an external pump 7.

Specifically, the external pump 7 and the liquid guiding tube 3 are communicated with each other, and the external pump 7 drives the working fluid (such as water or coolant) to circulate inside the water block 2 and the liquid guiding tube 3 to achieve the same functions and effects of the first preferred embodiment.

In another preferred embodiment, the external pump 7 may be substituted by an external water supply device (not shown in the figures), and the external water supply device may be communicated to the liquid guiding tube 3. When the cooling liquid circulated in the liquid guiding tube 3 is evaporated and reduced to a predetermined quantity, the external water supply device may supply additional cooling liquid to the water cooling system 10.

Figure 6:
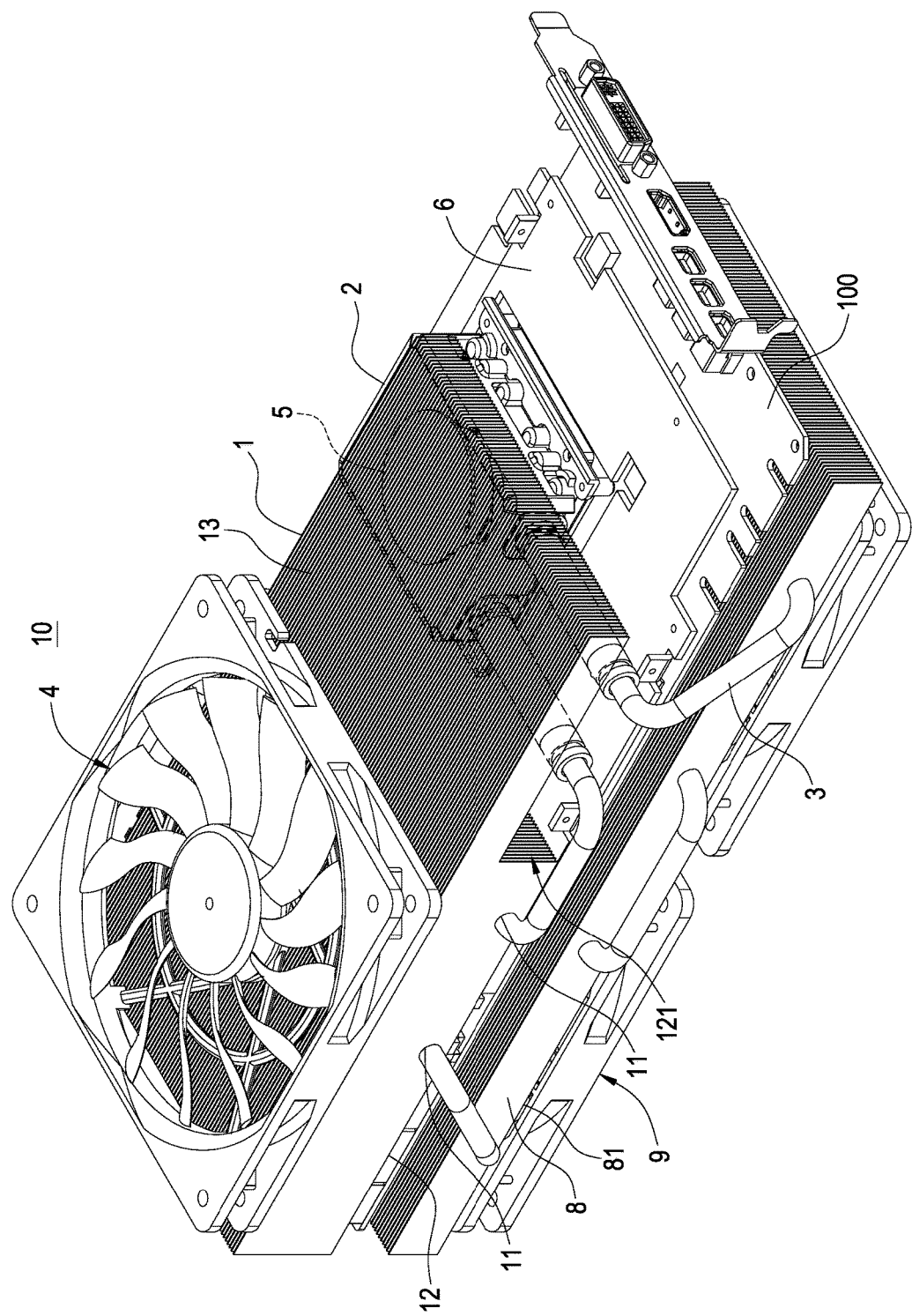
FIG. 6 is a perspective view of a water cooling system in accordance with a third preferred embodiment of this disclosure.
Figure 7:
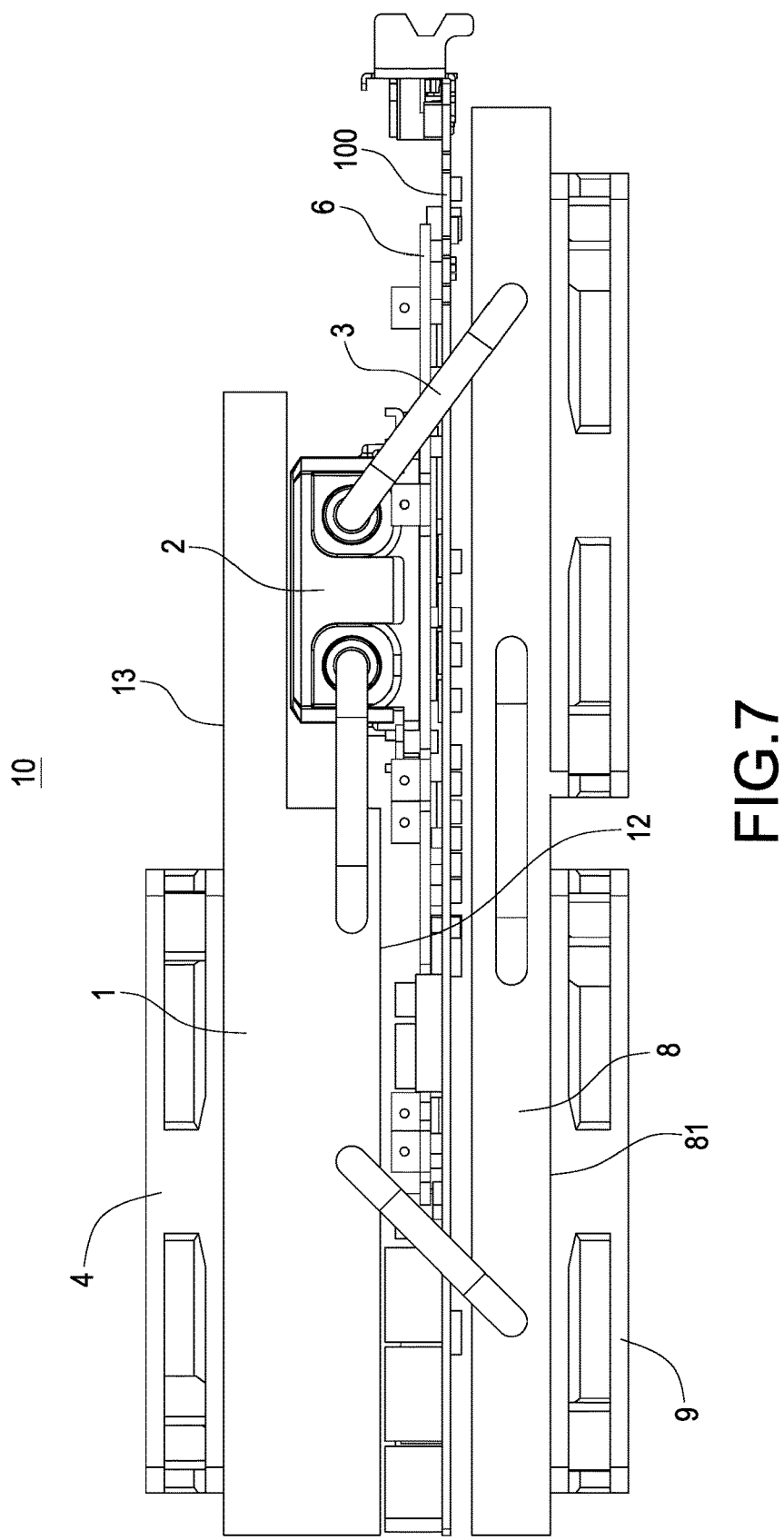
FIG. 7 is a side view of a water cooling system in accordance with the third preferred embodiment of this disclosure.

With reference to FIGS. 6 and 7 for the third preferred embodiment of this disclosure, the third preferred embodiment is substantially the same as the first preferred embodiment except that the water cooling system 10 of the third preferred embodiment further comprises an auxiliary fin module 8 and an auxiliary fan 9.

Further, the fin module 1 and the auxiliary fin module 8 are installed on both opposite sides of the circuit board 100 respectively, and the auxiliary fan 9 is configured to be corresponsive to the auxiliary fin module 8, and the liquid guiding tube 3 is passed and fixed to the auxiliary fin module 8 and thermally coupled to the auxiliary fin module 8, so that the working fluid (such as water or coolant) in the liquid guiding tube 3 can transmit the heat to the auxiliary fin module 8 and the auxiliary fan 9 quickly, and the auxiliary fin module 8 and the auxiliary fan 9 further dissipate the heat to the outside, so as to improve the heat dissipation efficiency of the water cooling system 10.

Wherein, the auxiliary fan 9 is installed on the bottom side 81 of the auxiliary fin module 8. However, this disclosure is not limited by such arrangement only, but the auxiliary fan 9 may also be installed on a lateral side of the auxiliary fin module 8.

In the first preferred embodiment, the through hole 11 is inwardly formed from the top side 13 of the fin module 1. In the third preferred embodiment, the through hole 11 is formed between the bottom side 12 and the top side 13 of the fin module 1.

Figure 8:
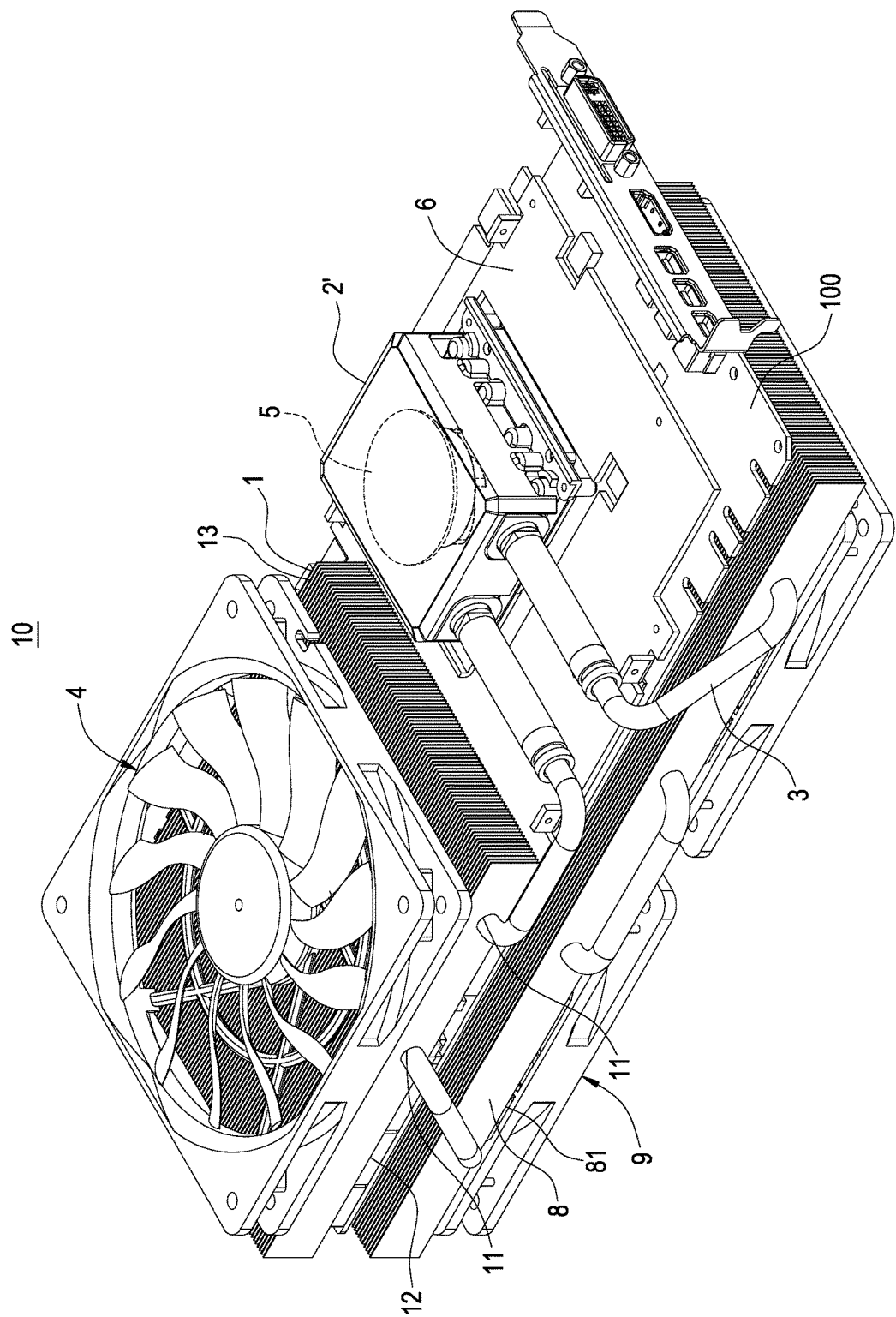
FIG. 8 is a perspective view of a water cooling system in accordance with a fourth preferred embodiment of this disclosure.
Figure 9:
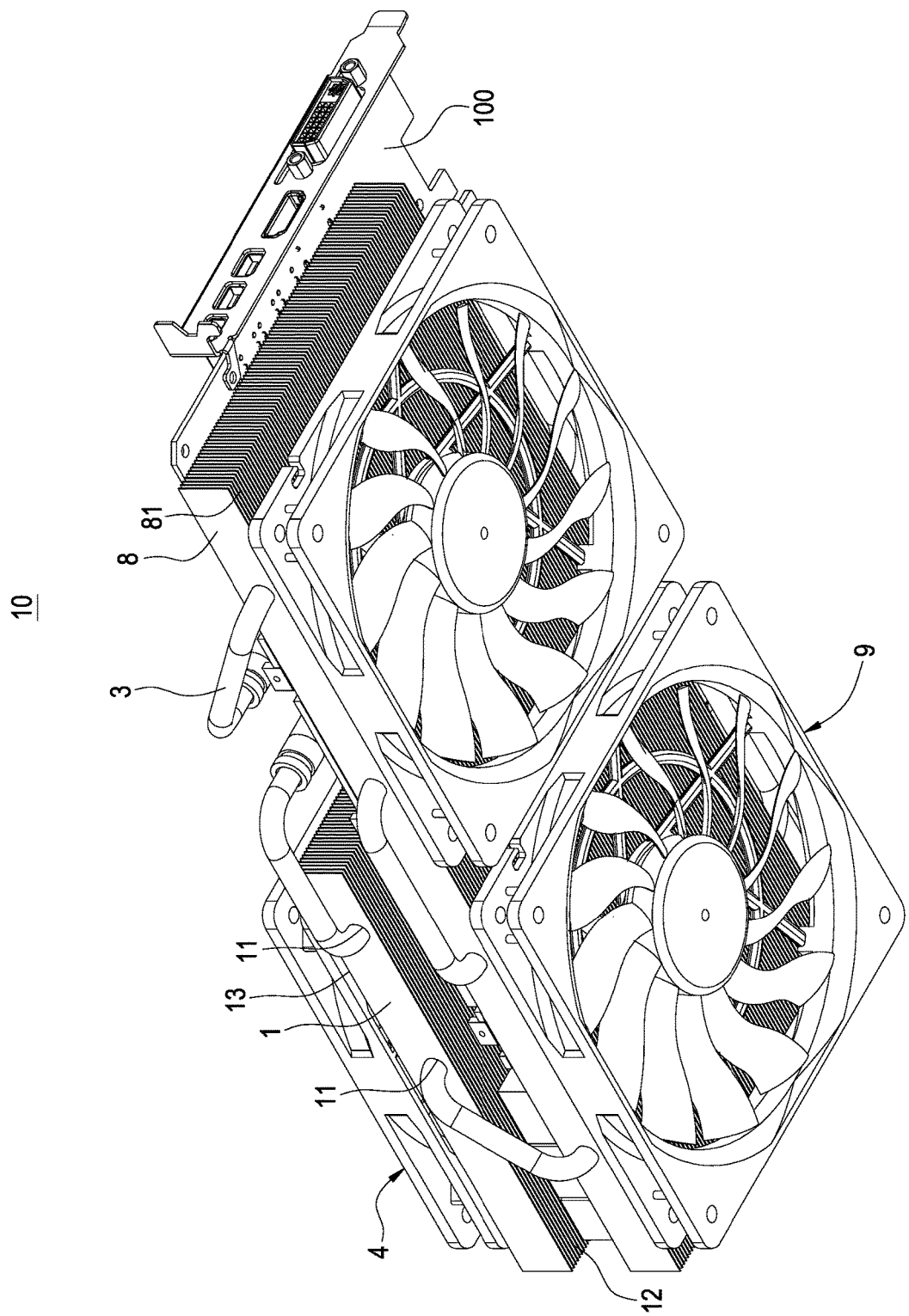
FIG. 9 is another perspective view of a water cooling system in accordance with the fourth preferred embodiment of this disclosure.

With reference to FIGS. 8 and 9 for a water cooling system 10 in accordance with the fourth preferred embodiment of this disclosure, the fourth preferred embodiment is substantially the same as the third preferred embodiment except that the water block 2' of the fourth preferred embodiment is not stacked together with the fin module 1.

Specifically, the water block 2' is just fixed on the circuit board 100, and the bottom side 12 of the fin module 1 does not have any concave groove 121, so that the water block 2' is not accommodated in the concave groove 121 of the third preferred embodiment, and the top of the water block 2' is not thermally coupled to the fin module 1, but the fan 4, the fin module 1, the auxiliary fin module 8, and the auxiliary fan 9 are still installed on both opposite sides of the circuit board 100 to improve the heat dissipation efficiency of the water cooling system 10.

In summation of the description above, this disclosure achieves the expected effects, overcomes the drawbacks of the prior art, and complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A water cooling system, for a circuit board having a heat generating component installed thereon, comprising:
   a fin module, comprising a plurality of fins installed on the circuit board, wherein each of the plurality of fins has at least one cut-out notch formed in an upper surface thereof, and the cut-out notches of the plurality of fins form at least one through hole;
   a water block, clamped between the fin module and the circuit board, and having a side thermally coupled to the heat generating component, and further having a liquid inlet end and a liquid outlet end;
   at least one liquid guiding tube, communicating with the liquid inlet end and the liquid outlet end, and passing and being fixed into the through hole, and thermally coupled to an inner wall of the through hole; and
   a fan, configured to be corresponsive to the fin module.

2. The water cooling system of claim 1, wherein the bottom side of the fin module has a concave groove, and the water block is accommodated in the concave groove, and the top of the water block is thermally attached to an inner wall of the concave groove.

3. The water cooling system of claim 1, further comprising a pump accommodated inside the water block.

4. The water cooling system of claim 1, further comprising an external pump communicated with the liquid guiding tube.

5. The water cooling system of claim 1, wherein the circuit board has a plurality of electronic components installed thereon, and the bottom side of the fin module is thermally coupled to the electronic components.

6. The water cooling system of claim 5, further comprising a fixed board fixed onto the circuit board, and the fin module is fixed onto the fixed board, and the fixed board has a first through opening and a second through opening, and the water block being passed through the first through opening, fixed to the circuit board, and thermally coupled to the heat generating component, and the bottom side of the fin module being passed through the second through opening to thermally couple to the electronic component.

7. The water cooling system of claim 1, wherein the through hole comes with a plural quantity, and the through holes are formed inwardly from the top side of the fin module and spaced in parallel to one another.

8. The water cooling system of claim 1, further comprising an auxiliary fin module and an auxiliary fan installed on both opposite sides of the circuit board respectively, and the auxiliary fan being configured to be corresponsive to the auxiliary fin module, and the liquid guiding tube being passed and fixed to the auxiliary fin module and thermally coupled to the auxiliary fin module.

9. The water cooling system of claim 1, wherein the fin module, the water block and the fan have a total thickness from 2.0 cm to 5.4 cm.

10. The water cooling system of claim 1, wherein the fan is installed on a lateral side of the fin module.

11. A water cooling system, for a display card having a graphic processing unit installed thereon, comprising:
    a fin module, comprising a plurality of fins installed on the circuit board, wherein each of the plurality of fins has at least one cut-out notch formed in an upper surface thereof, and the cut-out notches of the plurality of fins form at least one through hole;
    a water block, clamped between the fin module and the display card, and having a top thermally coupled to the fin module, and a bottom thermally coupled to the graphic processing unit, and further having a liquid inlet end and a liquid outlet end;
    a liquid guiding tube, with an end communicating with the liquid inlet end, and the other end communicating with the liquid outlet end, and the liquid guiding tube passing and being fixed into the through hole and thermally coupled to an inner wall of the through hole; and
    a fan, installed to the top side of the fin module.

12. The water cooling system of 11, wherein the bottom side of the fin module has a concave groove, and the water block is accommodated in the concave groove, and the top of the water block is thermally coupled to an inner wall of the concave groove.

13. The water cooling system of 11, further comprising a pump accommodated inside the water block.

14. The water cooling system of claim 11, further comprising an external pump communicated with the liquid guiding tube.

15. The water cooling system of claim 11, wherein the display card has a plurality of electronic components installed thereon, and the bottom side of the fin module is thermally coupled to the electronic component.

16. The water cooling system of claim 15, further comprising a fixed board fixed onto the display card, and the fin module being fixed onto the fixed board, and the fixed board having a first through opening and a second through opening, and the water block being fixed to the display card, and passed through the first through opening to thermally couple to the heat generating component, and the bottom side of the fin module being passed through the second through opening to thermally couple the electronic component.

17. The water cooling system of claim 11, wherein the through hole comes with a plural quantity, and the through holes are formed inwardly from the top side of the fin module and spaced parallel to one another.

18. The water cooling system of claim 11, further comprising an auxiliary fin module and an auxiliary fan installed on both opposite sides of the display card respectively, and the auxiliary fan is installed on the bottom side of the auxiliary fin module, and the liquid guiding tube is passed and fixed to the auxiliary fin module and thermally coupled to the auxiliary fin module.

19. The water cooling system of claim 11, wherein the fin module, the water block and the fan have a total thickness from 2.0 cm to 5.4 cm.

20. A water cooling system, for a circuit board having a heat generating component installed thereon, comprising:
 a fin module, installed on the circuit board, and having at least one through hole;
 a water block, vertically clamped between the fin module and the circuit board so as to be disposed between the fin module and the circuit board in a vertical direction, and having a side thermally coupled to the heat generating component, and further having a liquid inlet end and a liquid outlet end;
 at least one liquid guiding tube, communicating with the liquid inlet end and the liquid outlet end, and passing and being fixed into the through hole, and thermally coupled to an inner wall of the through hole; and
 a fan, configured to be corresponsive to the fin module.

21. A water cooling system, for a display card having a graphic processing unit installed thereon, comprising:
 a fin module, installed on the circuit board, and having at least one through hole;
 a water block, vertically clamped between the fin module and the display card so as to be disposed between the fin module and the display card in a vertical direction, and having a top thermally coupled to the fin module, and a bottom thermally coupled to the graphic processing unit, and further having a liquid inlet end and a liquid outlet end;
 a liquid guiding tube, with an end communicating with the liquid inlet end, and the other end communicating with the liquid outlet end, and the liquid guiding tube passing and being fixed into the through hole and thermally coupled to an inner wall of the through hole; and
 a fan, installed to the top side of the fin module.

\* \* \* \* \*